(12) United States Patent
Zhang

(10) Patent No.: US 11,839,038 B2
(45) Date of Patent: Dec. 5, 2023

(54) DISPLAY DEVICE AND VEHICLE

(71) Applicant: Shanghai Tianma Micro-Electronics Co., Ltd., Shanghai (CN)

(72) Inventor: Xiaoyin Zhang, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 17/401,649

(22) Filed: Aug. 13, 2021

(65) Prior Publication Data

US 2022/0386483 A1     Dec. 1, 2022

(30) Foreign Application Priority Data

May 25, 2021   (CN) .......................... 202110573386.5

(51) Int. Cl.
| | | |
|---|---|---|
| *B60K 35/00* | (2006.01) | |
| *H05K 5/02* | (2006.01) | |
| *H05K 5/00* | (2006.01) | |

(52) U.S. Cl.
CPC .......... *H05K 5/0217* (2013.01); *B60K 35/00* (2013.01); *H05K 5/0017* (2013.01); *B60K 2370/67* (2019.05)

(58) Field of Classification Search
None
See application file for complete search history.

(56) References Cited

U.S. PATENT DOCUMENTS

| | | | | |
|---|---|---|---|---|
| 9,320,138 | B2* | 4/2016 | Lee | H05K 5/03 |
| 9,978,293 | B2* | 5/2018 | Cho | G06F 1/16 |
| 10,290,240 | B2* | 5/2019 | Kang | G06F 1/1652 |
| 10,440,838 | B2* | 10/2019 | Heo | G06F 3/1446 |
| 10,692,406 | B2* | 6/2020 | Perez-Bravo | G09F 13/00 |
| 10,830,580 | B2* | 11/2020 | Hodowany | G01B 11/272 |
| 11,032,926 | B2* | 6/2021 | Zhu | F16H 25/20 |
| 11,051,414 | B2* | 6/2021 | Hou | H05K 5/0247 |
| 2014/0198465 | A1* | 7/2014 | Park | G09F 9/00 |
| | | | | 361/749 |
| 2015/0123914 | A1* | 5/2015 | Choi | G06F 1/1652 |
| | | | | 345/173 |
| 2015/0296641 | A1* | 10/2015 | Song | H05K 5/0217 |
| | | | | 361/679.01 |

(Continued)

FOREIGN PATENT DOCUMENTS

| | | |
|---|---|---|
| CN | 103915041 A | 7/2014 |
| CN | 104615393 A | 5/2015 |

(Continued)

*Primary Examiner* — Xanthia C Cunningham
(74) *Attorney, Agent, or Firm* — ANOVA LAW GROUP PLLC

(57) ABSTRACT

Display device and vehicle are provided. The display device includes a display panel and an adjustment assembly arranged on a side facing away from a light emitting surface of the display panel and used to bend the display panel. in a bent state, the display panel includes a first display area and a second display area, and the display panel is bent at a junction of the first display area and the second display area, the adjustment assembly is configured to be movable to change a bending position of the display panel and adjust a range of the first display area and a range of the second display area.

18 Claims, 8 Drawing Sheets

(56) References Cited

U.S. PATENT DOCUMENTS

| | | | | |
|---|---|---|---|---|
| 2016/0127674 A1* | 5/2016 | Kim | .................. | H04N 21/42204 |
| | | | | 348/739 |
| 2016/0295711 A1* | 10/2016 | Ryu | ..................... | G09F 9/301 |
| 2017/0188470 A1* | 6/2017 | Cho | ..................... | H05K 5/0017 |
| 2017/0262057 A1* | 9/2017 | Knittl | ..................... | B60K 35/00 |
| 2018/0220537 A1* | 8/2018 | Heo | ..................... | G06F 3/1446 |
| 2018/0260001 A1* | 9/2018 | Klug | ..................... | B60K 35/00 |
| 2019/0098775 A1* | 3/2019 | Cho | ..................... | H05K 5/0017 |
| 2020/0413550 A1* | 12/2020 | Kuo | .................. | G02F 1/133331 |
| 2021/0029842 A1* | 1/2021 | Gross | ..................... | G06F 1/1652 |
| 2021/0212223 A1* | 7/2021 | Song | ..................... | B60K 35/00 |
| 2021/0323487 A1* | 10/2021 | Kim | ..................... | B60R 13/0823 |

FOREIGN PATENT DOCUMENTS

| | | | |
|---|---|---|---|
| CN | 105578226 A | 5/2016 | |
| CN | 111308798 A | 6/2020 | |
| CN | 111556820 A | 8/2020 | |

* cited by examiner

DISPLAY DEVICE AND VEHICLE

CROSS-REFERENCE TO RELATED APPLICATIONS

This application claims priority of Chinese Patent Application No. 202110573386.5, filed on May 25, 2021, the entire contents of which are hereby incorporated by reference.

FIELD OF THE DISCLOSURE

The present disclosure generally relates to the field of display technology and, more particularly, relates to a display device and a vehicle.

BACKGROUND

With the development of technology, places or situations where display devices can be applied are also increasing. For example, a display device can be installed on a vehicle to provide a driver and/or a carpooler with required or expected image information. However, the display device on the vehicle can only be kept in a fixed state. It is difficult to adjust a display screen according to viewing needs, thereby causing inconvenience in certain usage scenarios.

BRIEF SUMMARY OF THE DISCLOSURE

One aspect of the present disclosure provides a display device. The display device includes a display panel and an adjustment assembly arranged on a side facing away from a light exiting surface of the display panel and configured to bend the display panel. in a bent state, the display panel includes a first display area and a second display area, and the display panel is bent at a junction of the first display area and the second display area, the adjustment assembly is configured to be movable to change a bending position of the display panel and adjust a range of the first display area and a range of the second display area.

Another aspect of the present disclosure provides a vehicle. The vehicle includes a display device. The display device includes a display panel and an adjustment assembly arranged on a side facing away from a light exiting surface of the display panel and configured to bend the display panel. in a bent state, the display panel includes a first display area and a second display area, and the display panel is bent at a junction of the first display area and the second display area, the adjustment assembly is configured to be movable to change a bending position of the display panel and adjust a range of the first display area and a range of the second display area.

The display device and the vehicle provided by the present disclosure can meet user's display screen visibility requirements and improve user experience. The display device can move the adjusting assembly according to a user's viewing needs. The adjusting assembly can be moved to change the bending position of the display panel and adjust the range of the first display area and the range of the second display area, thereby meeting the user's display screen visibility requirements and improving user experience.

Other aspects or embodiments of the present disclosure can be understood by those skilled in the art in light of the description, the claims, and the drawings of the present disclosure.

BRIEF DESCRIPTION OF THE DRAWINGS

By reading the following detailed description of non-limiting embodiments with reference to accompanying drawings, other features, purposes, and advantages of the present application will become more apparent. Same or similar reference signs indicate same or similar features, and drawings are not drawn according to actual scales.

DETAILED DESCRIPTION

Figure 1:
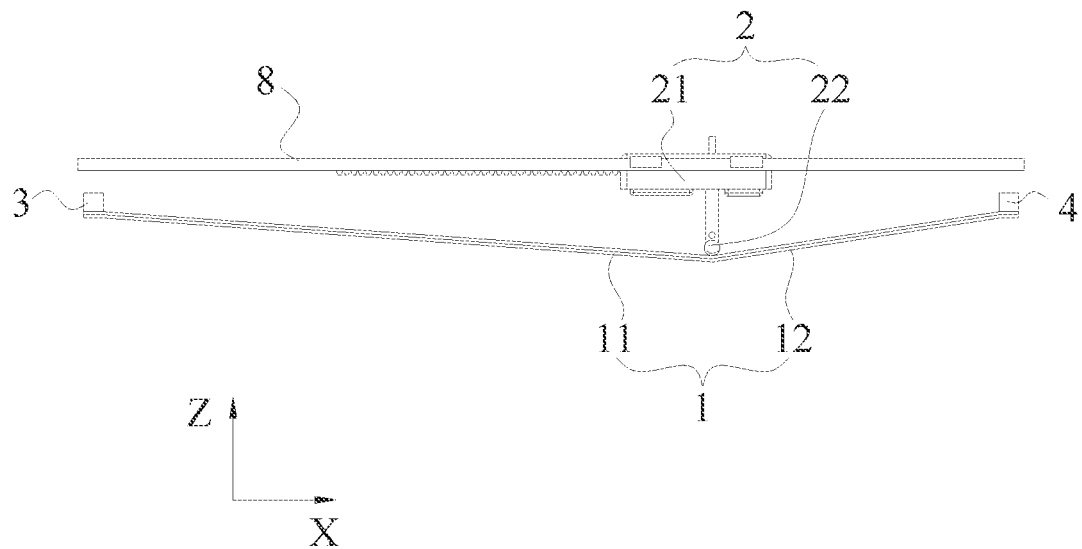
FIG. 1 illustrates a schematic diagram of a display device consistent with various disclosed embodiments of the present disclosure.

Features and exemplary embodiments of each aspect of the present disclosure will be described in detail below. To make the purpose, technical solutions, and advantages of the present disclosure clearer, the following further describes the present disclosure in detail in conjunction with drawings and specific embodiments. It can be understood that the specific embodiments described here are only configured to explain but not to limit the present disclosure. For those skilled in the art, the disclosure can be implemented without some of these specific details. The following description of the embodiments is only to provide a better understanding of the present disclosure by showing examples of the present disclosure.

It should be noted that in the disclosure, relational terms such as first and second are only configured to distinguish one entity or operation from another entity or operation, and do not necessarily require or imply any such actual relationship between these entities or operations or order. Moreover, the terms "include", "comprise" or any other variants thereof are intended to encompass non-exclusive inclusion, so that a process, method, product, or device including a series of elements not only includes the elements, but also includes other elements not clearly listed, or further includes elements inherent to the process, method, product, or device. Without more restrictions, elements defined by a sentence "include . . . " do not exclude existences of other identical or equivalent elements in the process, method, product, or device including the elements.

A reference to "one embodiment" or "an embodiment" in the disclosure means that a specific feature, structure, or characteristic described in conjunction with the embodiments may be included in at least one embodiment of the present disclosure. Appearances of a phrase shown in various places in the disclosure are not necessarily all referring to a same embodiment, nor are individual or alternative embodiments mutually exclusive with other embodiments.

In description of the disclosure, it should be noted that, unless otherwise clearly specified and limited, terms "installation", "connection", "coupling" and "fixing" should be interpreted in a broad sense. For example, connection can be fixed connection and can also be detachable connection, or integral connection; connection can be direct connection and can also be indirect connection through intermediate medium. and connection can be connection of inner sides of two elements. Those skilled in the art can understand specific meanings of the above terms in the present disclosure according to a specific situation.

Term "and/or" in the disclosure is merely an associated object, indicating that there may be three relationships, for example, A and/or B, which may indicate that A exists alone, A and B exist at a same time, and B exists alone. In addition, character "/" in the disclosure generally indicates that the associated object is an "or" relationship.

In the embodiments of the present disclosure, same reference numerals denote same components. For the sake of brevity, in different embodiments, detailed descriptions of same components are omitted. It should be understood that thicknesses, lengths and widths of various components in the embodiments of the disclosure shown in the drawings, as well as an overall thickness, length and width of an integrated device, are only exemplary descriptions, and should not constitute any limitations to the disclosure.

"Plurality" in the disclosure refers to two or more (including two).

FIG. 1 illustrates a schematic diagram of a display device consistent with various disclosed embodiments of the present disclosure.

As shown in FIG. 1, in one embodiment, the display device includes a display panel 1 and an adjustment assembly 2. The adjustment assembly 2 is arranged on a side facing away from a light exiting surface of the display panel 1. The adjustment assembly 2 is configured to bend the display panel 1. In a bent state, the display panel 1 includes a first display area 11 and a second display area 12. The display panel 1 is bent at a junction of the first display area 11 and the second display area 12. The adjustment assembly 2 is configured to be movable to change a bending position of the display panel 1 and adjust a range of the first display area 11 and a range of the second display area 12.

In some embodiments, the display panel 1 is a flexible display panel made of a flexible material. The flexible display panel is deformable and bendable. Optionally, in one embodiment, the display panel 1 is a flexible OLED display panel.

In some embodiments, the adjustment assembly 2 can press the display panel 1 from a side of the display panel 1 facing away from a light exiting surface to bend the display panel 1.

FIG. 1 illustrates number of adjustment assemblies 2 as a group. The number of the adjustment assemblies 2 may be at least two groups arranged in a first direction X shown in FIG. 1, so that the display panel 1 can be adjusted to present more bending shapes, thereby achieving various viewing requirements of users. Taking the number of adjustment assemblies 2 as two groups as an example, according to a bending position of the display panel 1, the adjustment assembly 2 can divide the display panel 1 into three display areas.

A first display area 11 and a second display area 12 are different areas of the display panel 1. Both the first display area 11 and the second display area 12 can be displayed independently to provide required image information. Exemplarily, the first display area 11 and the second display area 12 may respectively provide image information to different users.

Under an action of the adjustment assembly 2, the display panel 1 is bent to form an angle between the first display area 11 and the second display area 12, so that the first display area 11 and the second display area 12 are displayed at different angles. The first display area 11 and the second display area 12 respectively provide image information to different users. The first display area 11 and the second display area 12 are displayed at different angles, so that the first display area 11 and the second display area 12 can face corresponding users as much as possible, thereby improving user experience.

In one embodiment, the display device can move the adjustment assembly 2 according to a user's viewing needs. The adjustment assembly 2 can change a bending position of the display panel 1 and adjust a range of the first display area 11 and the second display area 12 by moving, to meet user's display screen visibility requirements and improve user experience.

In one embodiment, the display device can be applied to a vehicle to provide required or expected image information to drivers and/or carpoolers. Exemplarily, the first display area 11 is configured to provide image information to a driver, and the second display area 12 is configured to provide image information to a carpooler. Seats of the driver and the carpooler are separated, so the ideal display angles of the driver and the carpooler are different. The display panel 1 can be bent so that the first display area 11 and the second display area 12 are displayed at different angles. Therefore, the first display area 11 can face the driver as much as possible, while the second display area 12 can face the carpooler as much as possible, thereby improving visibility of the display screen and user experience. In some scenes or situations, such as reversing into the garage, a driver needs a larger display screen. The adjustment assembly 2 can be moved to change a bending position of the display panel 1 to increase a range of the first display area 11, which is convenient for the driver to observe a surrounding environment of the vehicle and increase safety. In other scenes or situations, the driver may not need a large display screen. The adjustment assembly 2 can be moved to change a bending position of the display panel 1 to decrease a range of the first display area 11 and increase a range of the second display area 12. The second display area 12 can provide a carpooler with a large display screen to improve user experience.

In one embodiment, the display panel 1 is not limited to two display areas. For example, the display panel 1 may further include a third display area (not shown). The third display area is connected to an end of the second display area 12 away from the first display area 11. The display panel 1 can also be bent at a junction of the second display area 12 and the third display area.

The display panel 1 can be installed on a mounting member in the display device or on a vehicle.

In some embodiments, the display device further includes a first mounting member 3 and a second mounting member 4 spaced apart in the first direction X. The first mounting member 3 and the second mounting member 4 are arranged on a side of the display panel 1 facing away from a light exiting surface. The display panel 1 is connected to the first mounting member 3 and the second mounting member 4. The adjustment assembly 2 is located between the first mounting member 3 and the second mounting member 4, and is configured to be movable in the first direction X.

The display panel 1 is mounted on the first mounting member 3 and the second mounting member 4. When the adjustment assembly 2 moves in the first direction X, a bending position of the display panel 1 can be adjusted in the first direction X. Size of the first display area 11 in the first direction X and size of the second display area 12 in the first direction X can be changed. Exemplarily, the display panel 1 is adhered to the first mounting member 3 and the second mounting member 4 by adhesive.

In some embodiments, the first display area 11 and the second display area 12 are arranged in the first direction X. An end of the first display area 11 away from the second display area 12 is connected to the first mounting member 3. An end of the second display area 12 away from the first display area 11 is connected to the second mounting member 4.

In some embodiments, the adjustment assembly 2 includes a base 21 and a supporting member 22. The base 21 is configured to be movable in the first direction X. The supporting member 22 is connected to the base 21 and configured to support the display panel 1 and bend the display panel 1. The base 21 is configured to install the supporting member 22 and drive the supporting member 22 to move in the first direction X, thereby changing a bending position of the display panel 1.

Figure 2:
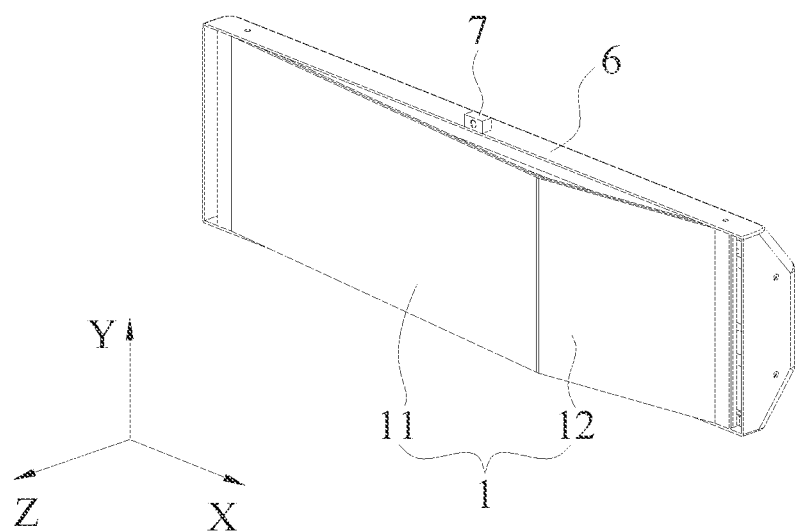
FIG. 2 illustrates a schematic diagram of another display device consistent with various disclosed embodiments of the present disclosure.
Figure 3:
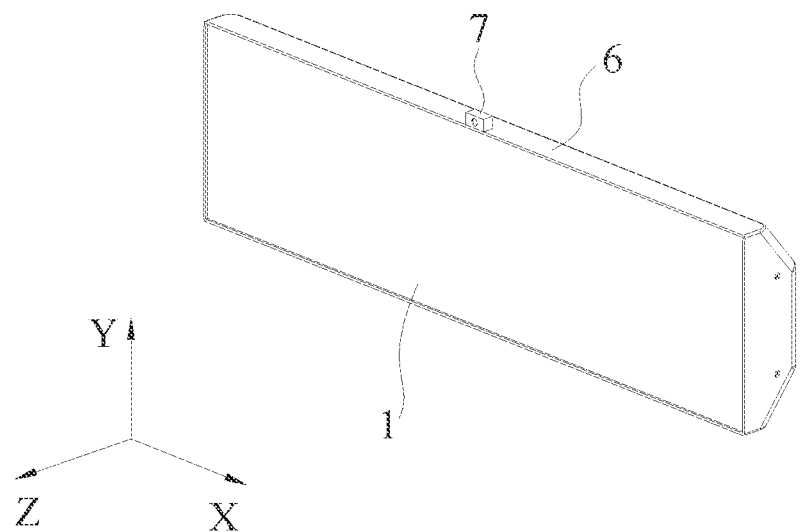
FIG. 3 illustrates another schematic diagram of the display device shown in FIG. 2, in which a display panel of the display device is not bent.
Figure 4:
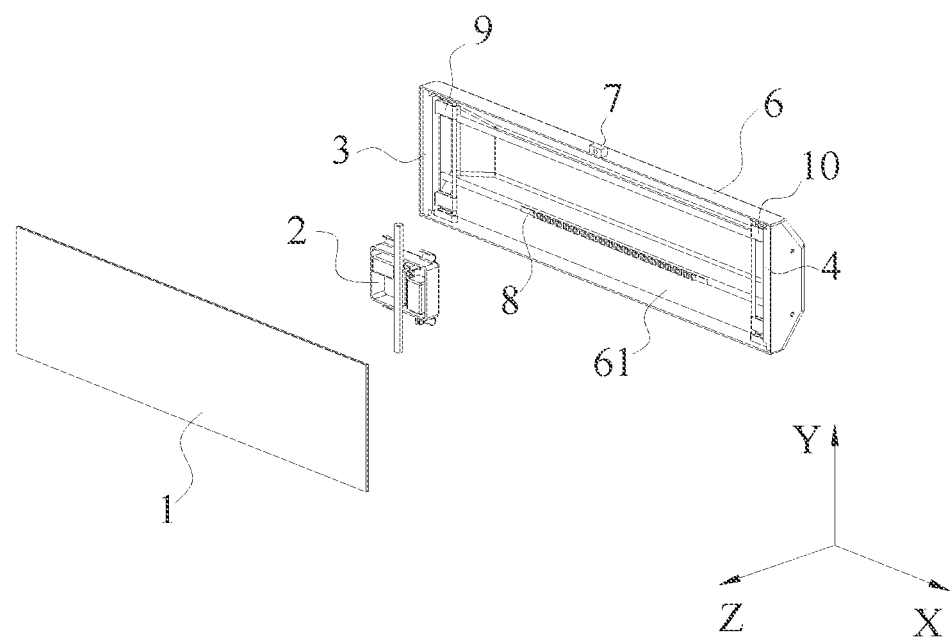
FIG. 4 illustrates an exploded schematic diagram of the display device shown in FIG. 3.
Figure 5:
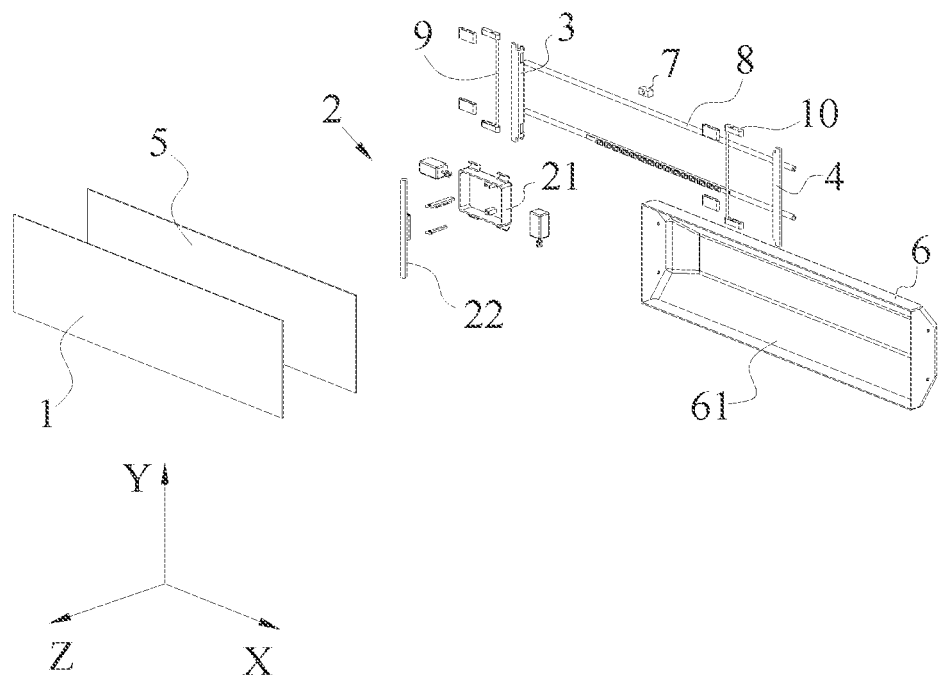
FIG. 5 illustrates another exploded schematic diagram of the display device shown in FIG. 3.

FIG. 2 illustrates a schematic diagram of another display device consistent with various disclosed embodiments of the present disclosure. FIG. 3 illustrates another schematic diagram of the display device shown in FIG. 2, in which a display panel of the display device is not bent. FIG. 4 illustrates an exploded schematic diagram of the display device described in FIG. 3. FIG. 5 illustrates another exploded schematic diagram of the display device described in FIG. 3.

As shown in FIGS. 2 to 5, in some embodiments, the supporting member 22 is movably arranged on the base 21 to change an angle between the first display area 11 and the second display area 12. The base 21 and the display panel 1 are arranged at intervals. The supporting member 22 can be close to or away from the base 21 to adjust a distance between the base 21 and the display panel 1, adjust a bending degree of the display panel 1, and change an angle between the first display area 11 and the second display area 12.

In one embodiment, an angle between the first display area 11 and the second display area 12 can be changed by moving the supporting member 22, that is, a display angle of the first display area 11 and a display angle of the second display area 12 can be adjusted. Therefore, the first display area 11 and the second display area 12 can face corresponding users as much as possible, thereby improving visibility of the display screen and user experience.

In some situations, the supporting member 22 can also be moved close to the base 21 according to needs, so that the supporting member 22 and the display panel 1 are spaced apart. The supporting member 22 no longer presses the display panel 1. The display panel 1 returns to a flat state under elastic action, that is, the display panel 1 is not bent. Exemplarily, a moving direction of the supporting member 22 is a third direction Z perpendicular to the display panel 1 in a flat state. The first direction X is parallel to the display panel 1 in a flat state.

When it is necessary to move the supporting member 22 in the first direction X, the supporting member 22 may be brought close to the base 21 first, so that the supporting member 22 is separated from the display panel 1 by a certain distance. The supporting member 22 moves in the first direction X, thereby preventing the supporting member 22 from rubbing the display panel 1 and reduce a movement resistance. When the supporting member 22 moves to a set position in the first direction X, the supporting member 22 is further away from the base 21 to press the display panel 1 and bend the display panel 1.

In some embodiments, the display device further includes an elastic plate 5 attached to a surface of the display panel 1 facing away from a light exiting surface. Exemplarily, the display panel 1 may be connected to the elastic plate 5 by adhesive. The elastic plate 5 is made of an elastic material and can perform deformation movements such as bending to a certain extent. The elastic plate 5 is configured to support the display panel 1. The first mounting member 3 and the second mounting member 4 can be adhered to the elastic plate 5 by adhesive.

In some embodiments, the adjustment assembly 2 is located on a side of the elastic plate 5 facing away from the display panel 1. The adjustment assembly 2 supports the elastic plate 5 to bend the display panel 1. The elastic plate 5 can play a buffering effect and reduce a risk of crushing the display panel 1 by the supporting member 22 of the adjustment assembly 2. When a bending position of the display panel 1 needs to be changed, the supporting member 22 needs to move in the first direction X. The elastic plate 5 can separate the display panel 1 from the supporting member 22 to prevent the supporting member 22 from rubbing the display panel 1 during the movement, thereby reducing a risk of damage to the display panel 1. When the display panel 1 needs to be restored to a flat state, the supporting member 22 no longer presses the elastic plate 5. The elastic plate 5 is flattened under an action of its own elastic restoring force and drives the display panel 1 to return to a flat state.

In some embodiments, the display device further includes a housing 6 having an opening 61. The adjustment assembly 2 is accommodated in the housing 6. The adjustment assembly 2 can be installed into the housing 6 through the opening of the housing 6. Exemplarily, the first mounting member 3 and the second mounting member 4 are also accommodated in the housing 6. The housing 6 can be configured to support and protect the adjustment assembly 2, the first mounting member 3, the second mounting member 4 and other components. Optionally, the housing 6 is configured to be fixed in a vehicle.

In some embodiments, the display panel 1 is configured to cover the opening of the housing 6. Exemplarily, when the display panel 1 is in a flat state, the display panel 1 is accommodated in the housing 6 and covers the opening of the housing 6. Shape of the display panel 1 matches shape of the opening of the housing 6. When the supporting member 22 of the adjustment assembly 2 moves and presses the display panel 1, the display panel 1 bends and protrudes to outside of the housing 6.

In some embodiments, the display device further includes a detection assembly 7, for detecting an object on one side of the light exiting surface of the display panel 1 and feedbacking and controlling a movement of the adjustment assembly 2. When the display device works, the detection assembly 7 detects a front object, such as a user, and controls the adjustment assembly 2 according to a user's position feedback, so that the supporting member 22 moves in the first direction X and/or in the third direction Z to bend the display panel 1 at a designated position and form a protrusion. A display angle and display range of the first display area 11 and a display angle and display range of the second display area 12 are changed according to the user's position, thereby meeting visibility requirements of a user's display screen, and improving user experience.

In some embodiments, the detection assembly 7 includes a camera. In some examples, the camera is mounted on outside of the housing 6 and fixed to the housing 6. In other examples, the camera can also be mounted on a vehicle.

In some embodiments, the detection assembly 7 further includes a controller (not shown) connected to a camera. The controller feedbacks and controls the adjustment assembly 2 according to information captured by the camera.

Figure 6:
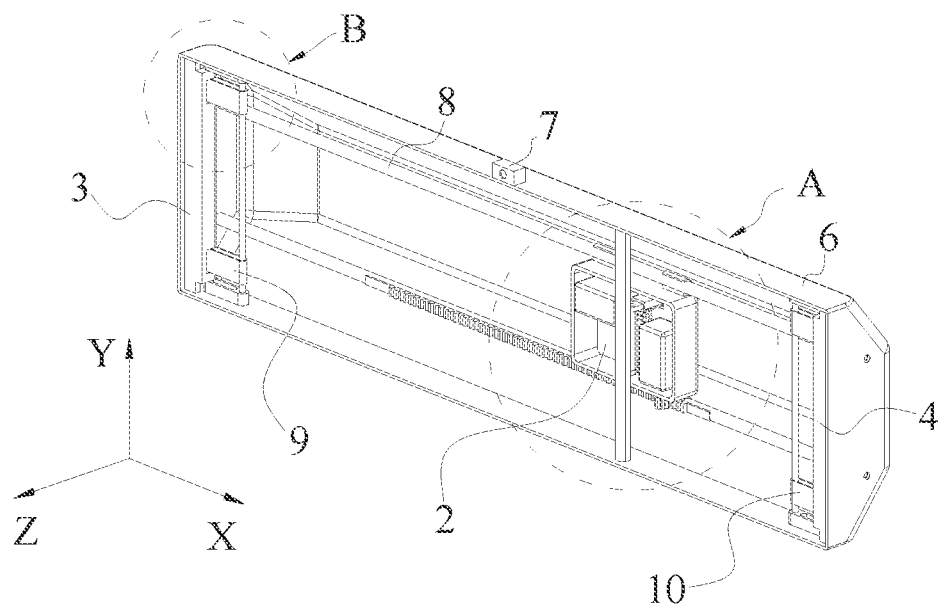
FIG. 6 illustrates a schematic diagram of the display device shown in FIG. 3, in which a display panel and an elastic part are not shown.
Figure 7:
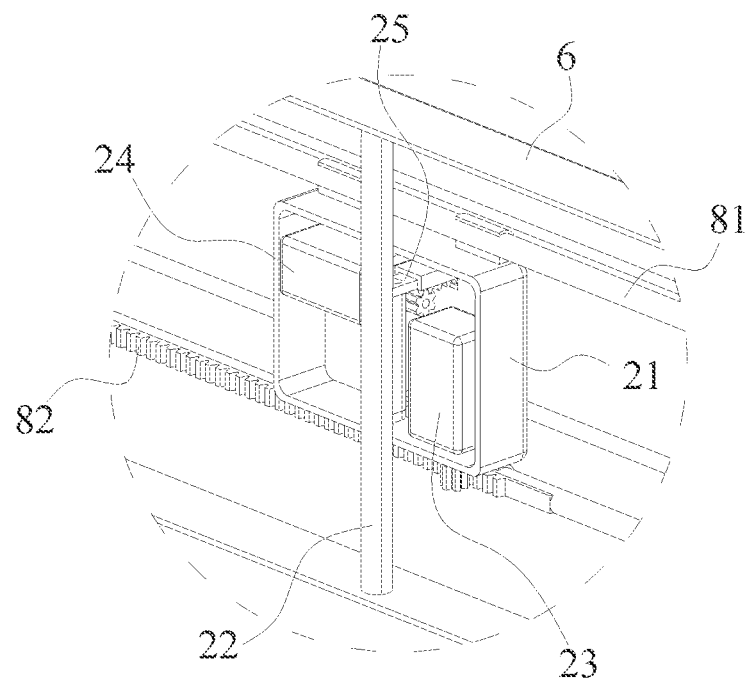
FIG. 7 illustrates an enlarged schematic diagram of the display device shown in FIG. 6 at a circle A.
Figure 8:
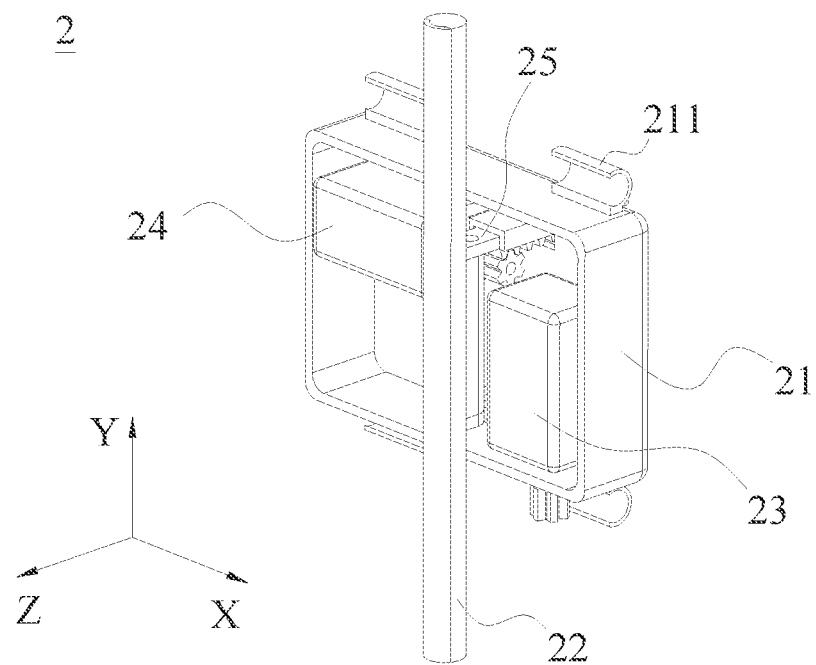
FIG. 8 illustrates a schematic diagram of an adjustment assembly of the display device shown in FIG. 6.
Figure 9:
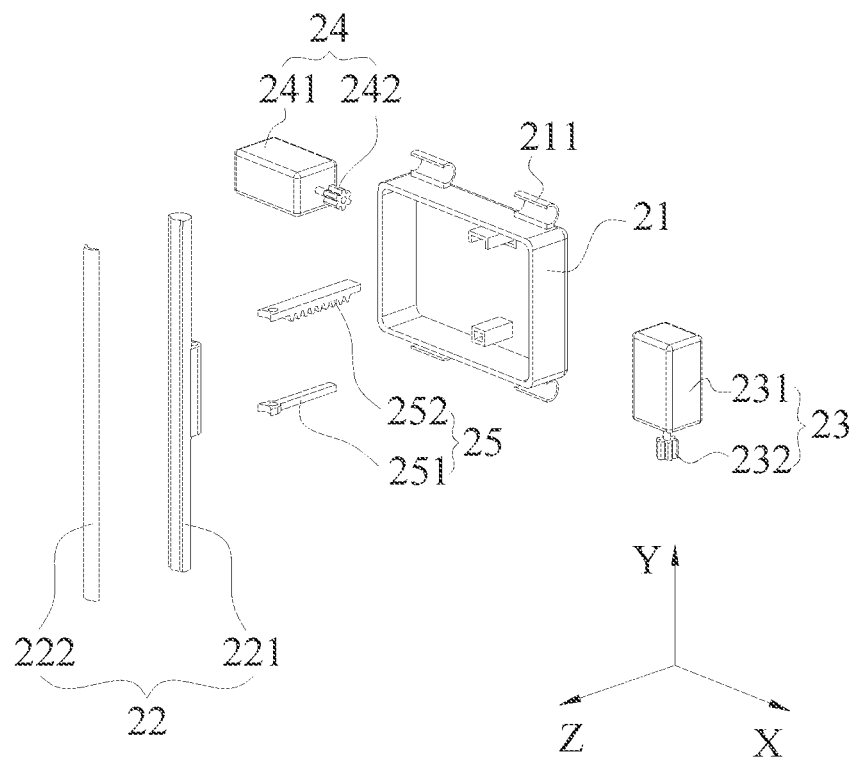
FIG. 9 illustrates an exploded schematic diagram of the adjustment assembly shown in FIG. 8.

FIG. 6 illustrates a schematic diagram of the display device shown in FIG. 3, in which a display panel and an elastic part are not shown. FIG. 7 illustrates an enlarged schematic diagram of the display device shown in FIG. 6 at a circle A. FIG. 8 illustrates a schematic diagram of an adjustment assembly of the display device shown in FIG. 6. FIG. 9 illustrates an exploded schematic diagram of the adjustment assembly shown in FIG. 8.

As shown in FIGS. 6 to 9, in some embodiments, the adjustment assembly 2 further includes a first driving member 23 connected to the base 21 and configured to drive the base 21 to move in the first direction X.

In some embodiments, the base 21 is generally a housing structure and has a receiving cavity. The receiving cavity forms an opening on a side facing the display panel 1.

In some embodiments, the first driving member 23 includes a first driving part 231 and a first transmission part 232. The first driving part 231 is accommodated in an accommodating cavity of the base 21 and fixed to the base 21. The first driving part 231 is configured to drive the first driving part 232 to rotate. When the first transmission part 232 rotates, the first driving part 231 drives the base 21 to move in the first direction X. The first driving part 231 may include a motor. The first transmission part 232 may be located outside the base 21.

In some embodiments, the display device further includes a first guide assembly 8 connected to the base 21 and configured for guiding the base 21 to move in the first direction X.

In some embodiments, the first guide assembly 8 includes a first guide rod 81 and a first guide rack 82. The first guide rod 81 and the first guide rack 82 extend in the first direction X.

The base 21 is provided with a sliding portion 211. The sliding portion 211 is sleeved on the first guide rod 81 and can slide along the first guide rod 81. The first transmission portion 232 of the first driving member 23 includes a first gear. The first gear meshes with the first guide rack 82. When the first gear rotates, the first gear moves along the first guide rack 82, and drive the first driving portion 231, the base 21 and the supporting member 22 to move in the first direction X.

In some embodiments, the supporting member 22 is movably arranged on the base 21 to change an angle between the first display area 11 and the second display area 12. Exemplarily, the supporting member 22 is movable in the third direction Z.

In some embodiments, the adjustment assembly 2 further includes a second driving member 24, which is connected to the base 21 and configured to drive the supporting member 22 to change an angle between the first display area 11 and the second display area 12.

In some embodiments, the second driving member 24 includes a second driving part 241 and a second transmission part 242. The second driving part 241 is accommodated in an accommodating cavity of the base 21 and fixed to the base 21. The second driving part 241 is configured to drive the second transmission part 242 to rotate. When the second transmission part 242 rotates, the second transmission part 242 drive the supporting member 22 to move in the third direction Z. Optionally, the second driving part 241 includes a motor.

In some embodiments, the adjustment assembly 2 further includes a second guide assembly 25 that connects the supporting member 22 and the second drive 24 to guide the supporting member 22 to move.

In some embodiments, the second guide assembly 25 includes a second guide rod 251 and a second guide rack 252. The second guide rod 251 and the second guide rack 252 extend in the third direction Z and are both connected to the supporting member 22. The second guide rod 251 is slidably connected to the base 21 in the third direction Z. The second guide rack 252 is slidably connected to the base 21 in the third direction Z.

The second transmission portion 242 of the second driving member 24 includes a second gear. The second gear meshes with the second guide rack 252. When the second gear rotates, the second gear drives the second guide rack 252 to move in the third direction Z, and drive the supporting member 22 to move in the third direction Z.

In some embodiments, the supporting member 22 includes a support portion 221 for supporting the display panel 1 to bend the display panel 1.

In some embodiments, the support portion 221 includes a rod extending in a second direction Y. The second direction Y is parallel to the display panel 1 and intersects the first direction X. Exemplarily, the second direction Y is perpendicular to the first direction X and the third direction Z. Exemplarily, in the second direction Y, size of the support portion 221 is slightly smaller than or equal to size of the display panel 1. Optionally, the rod is a round rod.

In some embodiments, in a flat state, the display panel 1 has a rectangular structure. The first direction X is parallel to a length direction of the display panel 1. The second direction Y is parallel to a width direction of the display panel 1. The third direction Z is parallel to a thickness direction of the display panel 1.

In some embodiments, the supporting member 22 further includes a cushioning pad 222. The cushioning pad 222 is arranged at least on a surface of the support portion 221 facing the display panel 1. The cushion 222 is arranged between the display panel 1 and the support part 221. When the support part 221 is moved in the third direction Z, the cushion 222 can play a buffering role, reducing an impact force exerted by the support part 221 on the display panel 1, and a risk of damage to the display panel 1. Optionally, a material of the cushion pad 222 is rubber.

Figure 10:
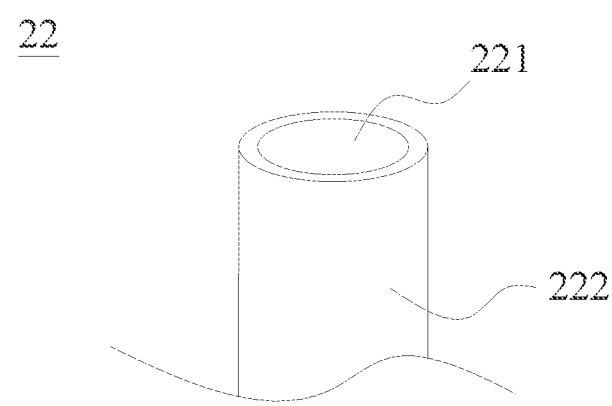
FIG. 10 illustrates a partial schematic diagram of a supporting member of an adjustment assembly of a display device consistent with various disclosed embodiments of the present disclosure.

FIG. 10 illustrates a partial schematic diagram of a supporting member of an adjustment assembly of a display device consistent with various disclosed embodiments of the present disclosure.

As shown in FIG. 10, in some embodiments, the support portion 221 includes a roller. A rotation axis of the roller is parallel to the second direction Y. When the roller is moved in the first direction X, the roller can roll along a surface of the elastic plate 5 to reduce a resistance during the movement and a friction force applied to the elastic plate 5.

In some embodiments, the cushion 222 covers the roller from outside.

Figure 11:
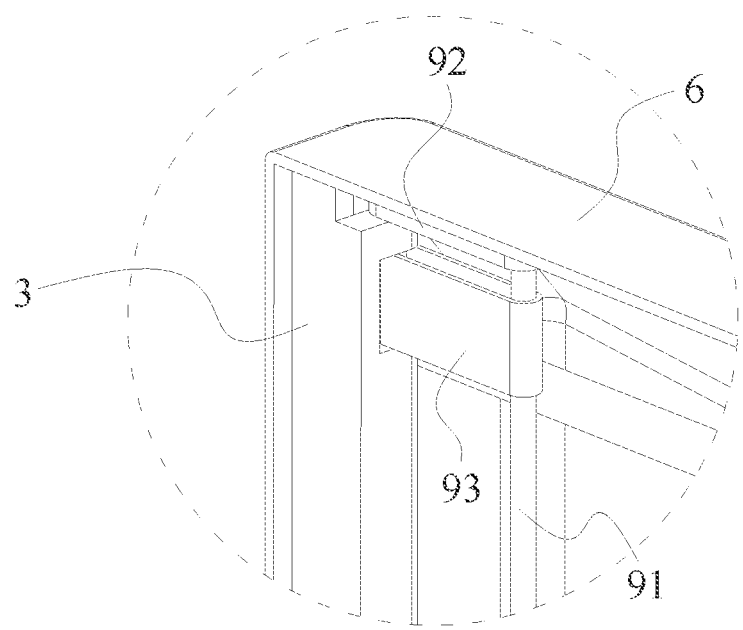
FIG. 11 illustrates an enlarged schematic diagram of the display device shown in FIG. 6 at a circle B.
Figure 12:
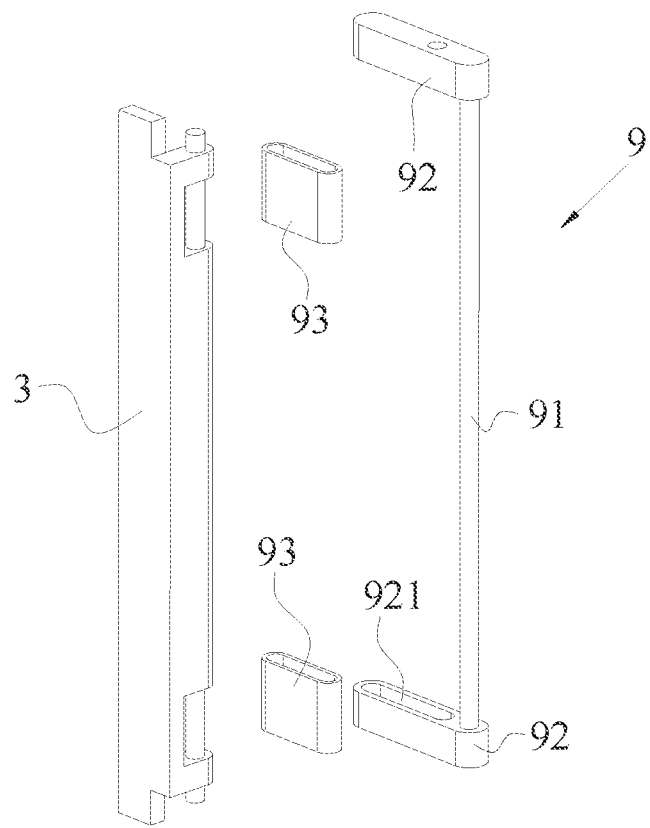
FIG. 12 illustrates a schematic diagram of a first mounting member and a third guide assembly shown in FIG. 6.

FIG. 11 illustrates an enlarged schematic diagram of the display device shown in FIG. 6 at a circle B. FIG. 12 illustrates a schematic diagram of a first mounting member and a third guide assembly shown in FIG. 6.

As shown in FIGS. 11 and 12, in some embodiments, the first mounting member 3 is configured to be movable in the first direction X. When the supporting member 22 moves in the third direction Z and presses the display panel 1, the display panel 1 bends and forms a protrusion. During a bending process of the display panel 1, the display panel 1 is stretched by force. The display panel 1 can drive the first mounting member 3 to move to change a distance between the first mounting member 3 and the second mounting member 4 and reduce a stretching deformation of the display panel 1, and a risk of damage to the display panel 1.

In some embodiments, the display device further includes a third guide assembly 9 connected to the first mounting member 3 and configured for guiding the first mounting member 3 to move in the first direction X. Exemplarily, the third guide assembly 9 is installed on the housing 6.

In some embodiments, the third guide assembly 9 includes a fixed rod 91, a guide block 92 and an elastic member 93. Optionally, the fixed rod 91 is fixed to the housing 6. The guide block 92 is connected to the fixed rod 91 and has a guide groove 921. At least part of the first mounting member 3 is inserted into the guide groove 921. The guide groove 921 is configured to guide the first mounting member 3 to move in the first direction X. The elastic member 93 connects the fixed rod 91 and the first mounting member 3 and is configured for pulling the first mounting member 3 close to the fixed rod 91. When the display panel 1 is bent and deformed, the elastic member 93 can be deformed according to a distance between the first mounting member 3 and the fixed rod 91. The elastic member 93 can pull the first mounting member 3 close to the fixed rod 91 and help guide a deformation of the display panel 1.

The elastic member 93 is an elastically deformable structure, which can take various forms. For example, in some embodiments, the elastic member 93 includes a spring, both ends of the spring are connected to the first mounting member 3 and the fixed rod 91 respectively. The spring is in a stretched state, which provides traction to the first mounting member 3. In other examples, the elastic member 93 includes a belt sleeved on the fixing rod 91 and the first mounting member 3. The belt is in a tensioned state to provide traction to the first mounting member 3.

Figure 13:
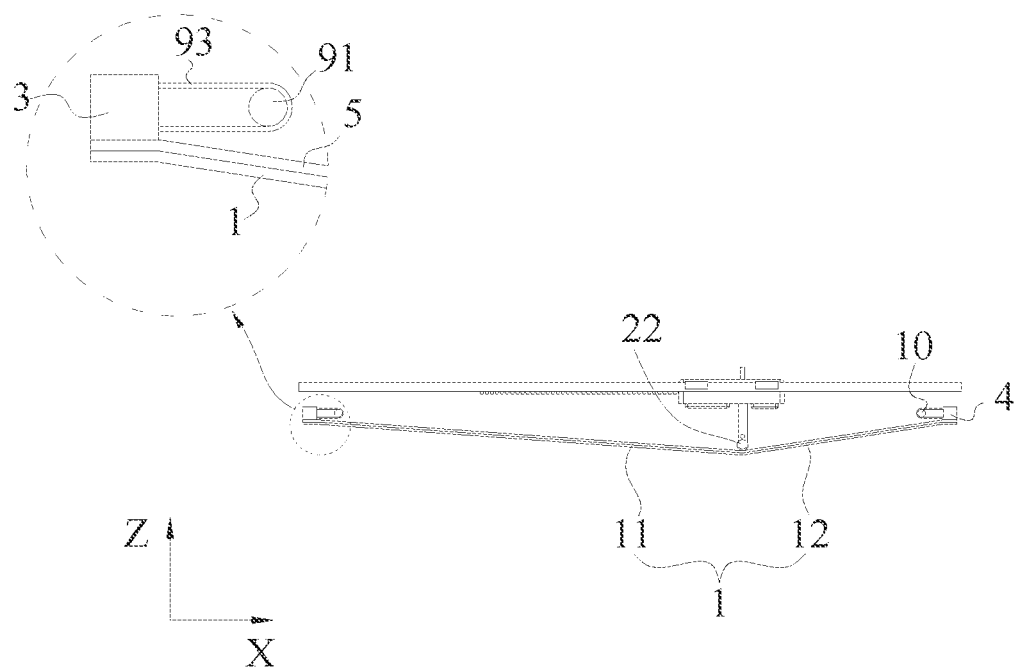
FIG. 13 illustrates a simplified schematic diagram of a display device consistent with various disclosed embodiments of the present disclosure.

FIG. 13 illustrates a simplified schematic diagram of a display device consistent with various disclosed embodiments of the present disclosure.

As shown in FIG. 13, in some embodiments, the fixed rod 91 is located on a side of the first mounting member 3 close to the second mounting member 4 in the first direction X. The elastic member 93 exerts a traction force on the first mounting member 3 toward the second mounting member 4. When the supporting member 22 moves in the third direction Z and presses the elastic plate 5 and the display panel 1, the elastic plate 5 and the display panel 1 are bent and deformed. The elastic member 93 can pull the first mounting member 3 close to the second mounting member 4. A traction force provided by the elastic member 93 can offset part of an elastic restoring force of the elastic panel, thereby helping guide bending of the elastic plate 5 and the display panel 1.

When the display panel 1 needs to be flattened to a flat state, the supporting member 22 moves in the third direction Z to move away from the display panel 1, that is, the supporting member 22 no longer presses the display panel 1. An elastic restoring force of the elastic plate 5 is relatively large, which can drive the first mounting member 3 away from the second mounting member 4 and stretch the elastic part 93.

Figure 14:
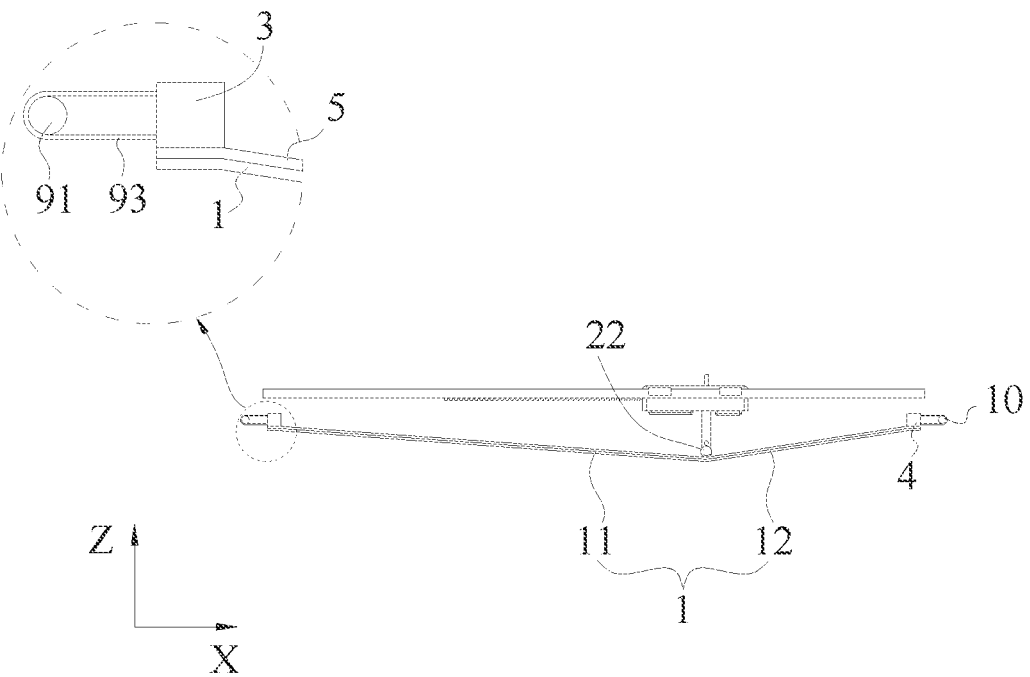
FIG. 14 illustrates a simplified schematic diagram of another display device consistent with various disclosed embodiments of the present disclosure.

FIG. 14 illustrates a simplified schematic diagram of another display device consistent with various disclosed embodiments of the present disclosure.

As shown in FIG. 14, in some embodiments, the fixed rod 91 is located on a side of the first mounting member 3 away from the second mounting member 4 in the first direction X. The elastic member 93 exerts a traction force on the first mounting member 3 away from the second mounting member 4. For the elastic plate 5 with a small elastic restoring force, the elastic member 93 can be configured to flatten the display panel 1.

Specifically, when the supporting member 22 moves in the third direction Z and presses the elastic plate 5 and the display panel 1, the elastic plate 5 and the display panel 1 are bent and deformed. The elastic plate 5 overcomes a traction force exerted by the elastic member 93 on the first mounting member 3 and stretches the elastic member 93. When the display panel 1 needs to be flattened to a flat state, the supporting member 22 moves in the third direction Z to move away from the display panel 1, that is, the supporting member 22 no longer presses the display panel 1. The elastic member 93 pulls the first mounting member 3 to move so that the first mounting member 3 is away from the second mounting member 4. Under an elastic restoring force of the elastic plate 5 and a traction force of the elastic member 93, the elastic plate 5 and the display panel 1 are flattened to a flat state.

In some embodiments, the second mounting member 4 is configured to be movable in the first direction X. When the supporting member 22 moves in the third direction Z and presses the display panel 1, the display panel 1 bends and forms a protrusion. During a bending process of the display panel 1, the display panel 1 is stretched by force. The display panel 1 can drive the first mounting member 3 and the second mounting member 4 to approach each other to reduce a stretching deformation of the display panel 1 and a risk of damage to the display panel 1.

In some embodiments, the display device further includes a fourth guide assembly 10 connected to the second mounting member 4 and configured for guiding the second mounting member 4 to move in the first direction X.

Figure 15:
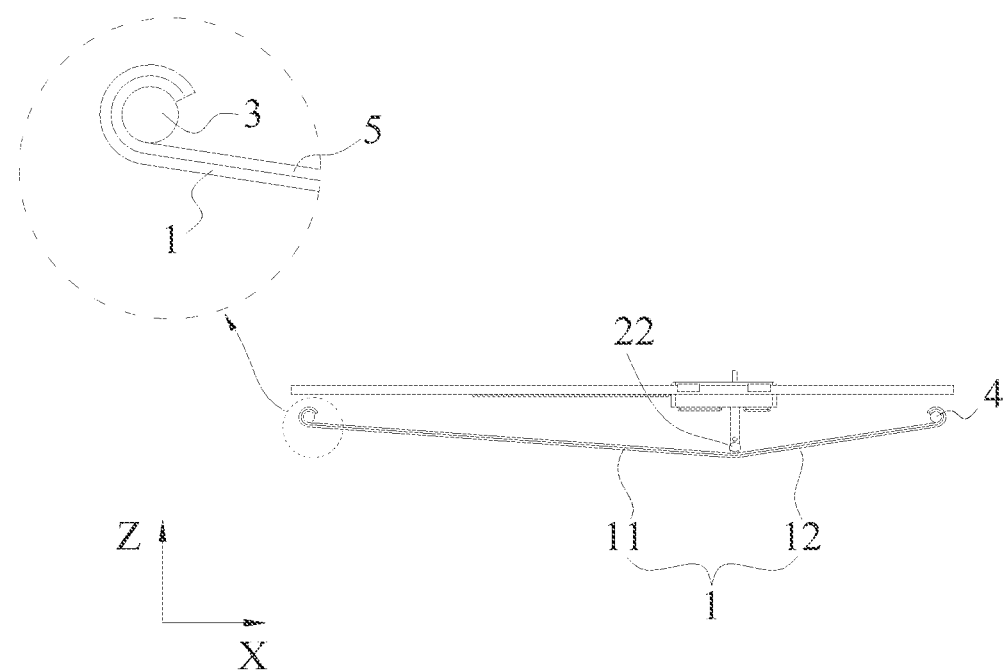
FIG. 15 illustrates a simplified schematic diagram of another display device consistent with various disclosed embodiments of the present disclosure.

FIG. 15 illustrates a simplified schematic diagram of another display device consistent with various disclosed embodiments of the present disclosure.

As shown in FIG. 15, the first mounting member 3 is configured to be rotatable. One end of the display panel 1 is wound on the first mounting member 3. Exemplarily, the first mounting member 3 is rotatably mounted on the housing 6.

When the supporting member 22 moves in the third direction Z and presses the display panel 1, the display panel 1 bends and forms a protrusion. During a bending process of the display panel 1, the first mounting member 3 rotates (e.g., counterclockwise) and unwinds the display panel 1 to reduce a stretching deformation of the display panel 1 and a risk of damage to the display panel 1. When the display panel 1 needs to be flattened, the first mounting member 3 rotates (e.g., clockwise) and winds the display panel 1, so that the display panel 1 can be tensioned and a risk of the display panel 1 being wrinkled can be reduced.

In some embodiments, the display device further includes a third driving member (not shown), and the third driving member is configured to drive the first mounting member 3 to rotate.

In some embodiments, the second mounting member 4 is configured to be rotatable. The other end of the display panel 1 is wound on the second mounting member 4.

Figure 16:
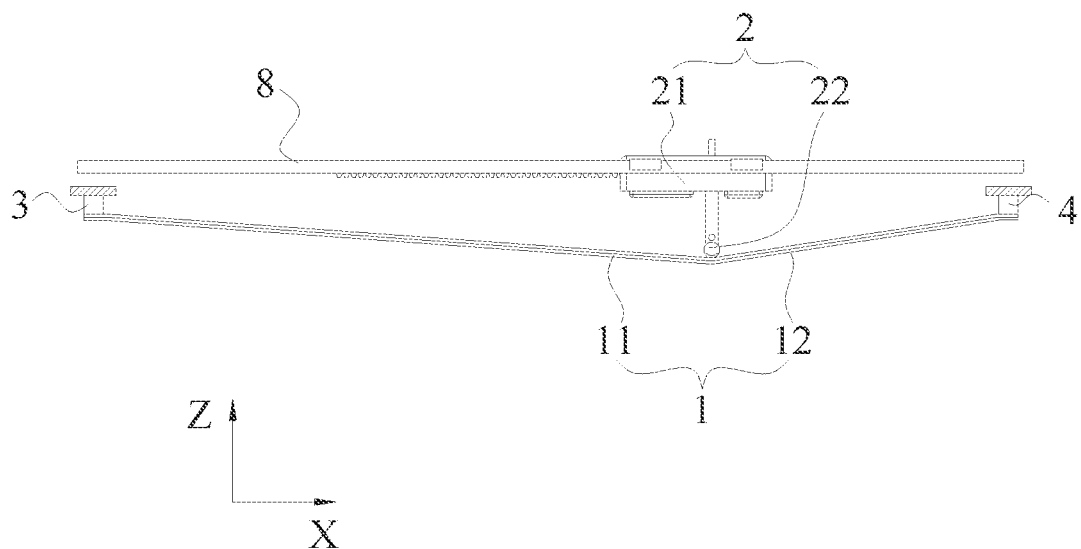
FIG. 16 illustrates a simplified schematic diagram of another display device consistent with various disclosed embodiments of the present disclosure.

FIG. 16 illustrates a simplified schematic diagram of another display device consistent with various disclosed embodiments of the present disclosure.

As shown in FIG. 16, in some embodiments, the display panel 1 is a stretchable display panel. The stretchable display panel has a good stretch resistance, which can increase an area of the display panel by stretching and can ensure a normal display in a stretched state.

In some embodiments, the first mounting member 3 and the second mounting member 4 may be fixedly arranged. Since the display panel 1 is a stretchable display panel, when the supporting member 22 is pressed against the display panel 1 and the display panel 1 is bent, even if the display panel 1 is stretched to a certain extent, a normal display of the display panel 1 can be ensured.

In other embodiments, the first mounting member 3 and the second mounting member 4 are configured to be movable in the first direction X.

The present disclosure also provides a vehicle. The vehicle includes a display device of any one of the above embodiments and has a same or corresponding beneficial effects as the display device included therein. Exemplarily, the vehicle includes a vehicle.

The above embodiments of the present disclosure do not describe all the details, nor do the embodiments limit the disclosure to only the specific embodiments described. Obviously, many modifications and changes can be made based on the above description. The specification selects and specifically describes the embodiments to better explain principles and practical applications of the disclosure, so that those skilled in the art can make good use of the disclosure and make modifications based on the disclosure. The disclosure is only limited by the appended claims and the full scope and equivalents thereof.

What is claimed is:

1. A display device, comprising:
a display panel; and
an adjustment assembly arranged on a side facing away from a light exiting surface of the display panel, and configured to bend the display panel, wherein
the adjustment assembly includes a base and a supporting member, the base is configured to be movable in a first direction, the supporting member is connected to the base and configured for supporting and bending the display panel, the adjustment assembly further includes a first driving member connected to the base and configured to drive the base to move in the first direction, and the display device further includes a first guide assembly connected to the base and configured to guide the base to move in the first direction, and
in a bent state, the display panel includes a first display area and a second display area, and the display panel is bent at a junction of the first display area and the second display area, the adjustment assembly is configured to be movable along the first direction to change a bending position of the display panel along the first direction and adjust a length of the first display area and a length of the second display area along the first direction.

2. The display device according to claim 1, wherein:
the display device further includes a first mounting member and a second mounting member spaced apart in the first direction, the first mounting member and the second mounting member being arranged on a side of the display panel facing away from the light exiting surface; and
the display panel is connected to the first mounting member and the second mounting member, and the adjustment assembly is located between the first mounting member and the second mounting member and is configured to be movable in the first direction.

3. The display device according to claim 2, wherein the first display area and the second display area are arranged in the first direction, an end of the first display area away from the second display area is connected to the first mounting member, and an end of the second display area away from the first display area is connected to the second mounting member.

4. The display device according to claim 2, wherein the supporting member is movably arranged on the base to change an angle between the first display area and the second display area.

5. The display device according to claim 4, wherein:
the adjustment assembly further includes a second driving member connected to the base and configured for driving the supporting member to change the angle between the first display area and the second display area; and
the adjustment assembly further includes a second guide assembly that connects the supporting member and the second driving member to guide the supporting member to move.

6. The display device according to claim 4, wherein the first mounting member is configured to be movable in the first direction.

7. The display device according to claim 6, further comprising a third guide assembly connected to the first mounting member and configured to guide the first mounting member to move in the first direction.

8. The display device according to claim 7, wherein the third guide assembly includes:
a fixed rod;
a guide block, connected to the fixed rod and having a guide groove, at least part of the first mounting member being inserted into the guide groove for guiding the first mounting member to move in the first direction; and
an elastic member, connecting the fixed rod and the first mounting member, and configured for pulling the first mounting member close to the fixed rod.

9. The display device according to claim 8, wherein:
the fixed rod is located on a side of the first mounting member away from the second mounting member in the first direction; or the fixed rod is located on a side of the first mounting member close to the second mounting member in the first direction.

10. The display device according to claim 6, wherein the second mounting member is configured to be movable in the first direction.

11. The display device according to claim 4, wherein the first mounting member is configured to be rotatable, and an end of the display panel is wound on the first mounting member.

12. The display device according to claim 1, wherein the supporting member includes a support portion and a cushioning pad, and the cushioning pad is arranged at least on a surface of the support portion facing the display panel.

13. The display device according to claim 1, wherein:
the supporting member includes a support portion, and the support portion includes a rod extending in a second direction, the second direction being parallel to the display panel and intersecting the first direction; or
the supporting member includes a support portion, the support portion includes a roller, and a rotation axis of the roller is parallel to the second direction.

14. The display device according to claim 1, further comprising:
an elastic plate attached to a surface of the display panel facing away from a light exiting surface of the display panel, the adjustment assembly being located on a side of the elastic plate facing away from the display panel; wherein
the adjustment assembly is configured to bend the display panel by supporting the elastic plate.

15. The display device according to claim 1, further comprising a detection assembly for detecting objects on a side of a light exiting surface of the display panel and feedbacking and controlling a movement of the adjustment assembly.

16. The display device according to claim 1, further comprising:
a housing including an opening;
the adjustment assembly being accommodated in the housing, and the display panel being used for covering the opening of the housing.

17. A display device, comprising:
a display panel; and
an adjustment assembly, arranged on a side facing away from a light-emitting surface of the display panel, and configured to bend the display panel, wherein
the adjustment assembly includes a base and a supporting member, the base is configured to be movable in a first direction, the supporting member is connected to the base and configured for supporting and bending the display panel,
in a bent state, the display panel includes a first display area and a second display area, and the display panel is bent at a junction of the first display area and the second display area, the adjustment assembly is configured to be movable along the first direction to adjust a length of the first display area and a length of the second display area, and movable along a second direction to change an angle between the first display area and the second display area,
the supporting member is movably arranged on the base to change an angle between the first display area and the second display area,
the adjustment assembly further includes a second driving member connected to the base and configured for driving the supporting member to change the angle between the first display area and the second display area, and
the adjustment assembly further includes a second guide assembly that connects the supporting member and the second driving member to guide the supporting member to move.

18. A vehicle, comprising:
a display device, comprising:
a display panel; and
an adjustment assembly arranged on a side facing away from a light exiting surface of the display panel, and configured to bend the display panel, wherein
the adjustment assembly includes a base and a supporting member, the base is configured to be movable in a first direction, the supporting member is connected to the base and configured for supporting and bending the display panel, the adjustment assembly further includes a first driving member connected to the base and configured to drive the base to move in the first direction, and the display device further includes a first guide assembly connected to the base and configured to guide the base to move in the first direction, and
in a bent state, the display panel includes a first display area and a second display area, and the display panel is bent at a junction of the first display area and the second display area, the adjustment assembly is configured to be movable along the first direction to change a bending position of the display panel along a first direction and adjust a length of the first display area and a length of the second display area along a first direction.

* * * * *